United States Patent
Xu et al.

(10) Patent No.: US 10,389,352 B1
(45) Date of Patent: Aug. 20, 2019

(54) GATE LOOP DIFFERENTIAL MODE CHOKE FOR PARALLEL POWER DEVICE SWITCHING CURRENT BALANCE

(71) Applicant: Ford Global Technologies, LLC, Dearborn, MI (US)

(72) Inventors: Fan Xu, Novi, MI (US); Lihua Chen, Farmington Hills, MI (US); Baoming Ge, Okemos, MI (US); Yan Zhou, Canton, MI (US); Shuitao Yang, Beaumont, TX (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/904,381

(22) Filed: Feb. 25, 2018

(51) Int. Cl.
*H02P 1/00* (2006.01)
*H03K 17/16* (2006.01)
*H02M 1/08* (2006.01)
*H02P 27/06* (2006.01)
*B60L 11/18* (2006.01)

(52) U.S. Cl.
CPC ........ *H03K 17/168* (2013.01); *B60L 11/1851* (2013.01); *H02M 1/08* (2013.01); *H02P 27/06* (2013.01)

(58) Field of Classification Search
CPC .............................. H02M 1/088; H03K 17/122
See application file for complete search history.

(56) References Cited

U.S. PATENT DOCUMENTS

2016/0261123 A1* 9/2016 Rapp ................... B60L 11/1812

FOREIGN PATENT DOCUMENTS

WO  2014134218 A1  9/2014
WO  2016166228 A1  10/2016

OTHER PUBLICATIONS

ABB Switzerland Ltd. "Paralleling of IGBT Modules", Application Note 5SYA 2098-00. Aug. 25, 2013, 10 pages.
Texas Instruments. "IGBT Gate Driver Reference Design for Parallel IGBTs with Short-Circuit Protection and External BJT Buffer", TIDUC70A. Revised Jan. 1, 2017, 33 pages.

* cited by examiner

*Primary Examiner* — Karen Masih
(74) *Attorney, Agent, or Firm* — David B. Kelley; Brooks Kushman P.C.

(57) ABSTRACT

A power electronics module is arranged to pass power between a traction battery and electric machine, and includes a pair of parallel power transistors and a differential mode choke arranged to, responsive to current flow through the choke, drive gate voltages of the power transistors apart to reduce differences in current magnitudes output by the transistors.

14 Claims, 4 Drawing Sheets ic
GATE LOOP DIFFERENTIAL MODE CHOKE FOR PARALLEL POWER DEVICE SWITCHING CURRENT BALANCE

TECHNICAL FIELD

This disclosure relates to power semiconductors and associated circuitry.

BACKGROUND

Hybrid-electric vehicles (HEVs) and battery electric vehicles (BEVs) may rely on a traction battery to provide power to a traction motor for propulsion, and a power inverter therebetween to convert direct current (DC) power to alternating current (AC) power. The typical AC traction motor is a three-phase motor powered by three sinusoidal signals each driven with 120 degrees phase separation but other configurations are also possible. Also, electrified vehicles include power electronics to condition and transfer power between the various power consuming and power producing/storing components. In high power applications, power semiconductors are often used in parallel to achieve high power output.

SUMMARY

Paralleled power semiconductor circuitry includes a pair of power transistors in parallel, a gate driver configured to power gates of the power transistors, and a differential mode choke. The choke is arranged with the pair and gate driver such that a difference in current magnitudes output by the power transistors results in current flow through the choke and lowers a gate voltage of the power transistor with the greater one of the current magnitudes.

Power semiconductor circuitry includes a pair of parallel power transistors, a gate driver configured to power gates of the power transistors, and a differential mode choke arranged to, responsive to current flow through the choke, lower a gate voltage of one of the power transistors and raise a gate voltage of the other of the power transistors to reduce the current flow.

A vehicle includes a traction battery, an electric machine, and a power electronics module arranged to pass power between the traction battery and electric machine. The power electronics module includes a pair of parallel power transistors and a differential mode choke arranged to, responsive to current flow through the choke, drive gate voltages of the power transistors apart to reduce differences in current magnitudes output by the transistors.

BRIEF DESCRIPTION OF THE DRAWINGS

FIG. 5 is a schematic diagram of the circuitry of FIG. 4 during device turn-on.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

As mentioned earlier, power semiconductors and power modules may need to be used in parallel to achieve high power output. The piece to piece variation of the power devices, the non-uniform circuitry, and other system parameters, however, may make it difficult for paralleled devices/modules to achieve current balancing. Unbalanced currents may cause unbalanced temperatures and voltage overshoot, which may impact traction inverter design and power device/module lifetime. So, unbalanced currents should be managed for power devices/modules paralleling operation.

The conduction resistance ($R_{ds-on}$) mismatch of paralleled devices/modules leads to unbalanced conduction currents. Most power device $R_{ds-on}$ values have positive temperature coefficients, which means the steady state current can be balanced automatically for paralleled devices.

Figure 1:
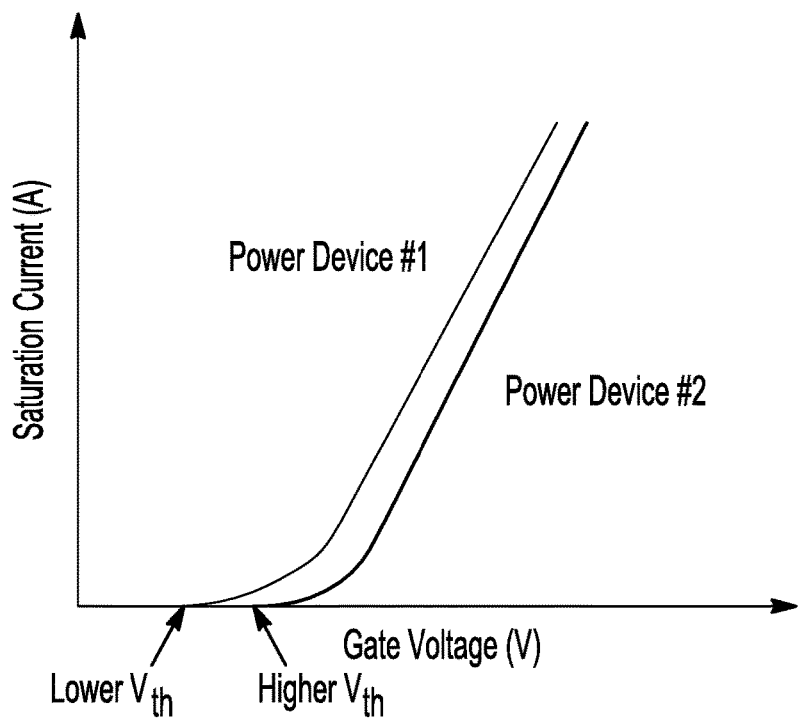
FIG. 1 is a plot of saturation current versus gate voltage for two parallel power devices having different threshold gate voltages.

Dynamic current unbalance is caused by the variation of threshold gate voltage $V_{th}$. FIG. 1 shows the transfer curve of two power devices with different $V_{th}$. With the smaller $V_{th}$, the power device turns on earlier and takes more current than the device with the larger $V_{th}$, which parallels to it during turn-on transient. During turn-off transient, the power device with the smaller $V_{th}$ will turn off later. The power device with the smaller $V_th$ will have higher current rising and falling speeds ($di_c/dt$) during switching transient. In addition to different $V_{th}$, the unsymmetrical gate drive parameters and gate loop impedance will also cause the different turn-on/off delay times and current rising/falling speeds for paralleled power devices.

Figure 2:
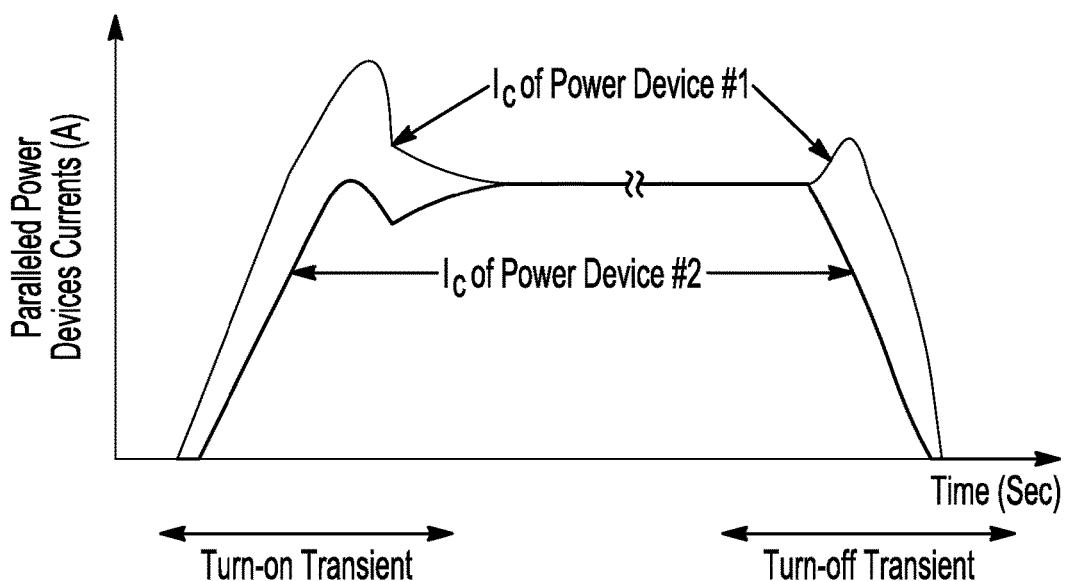
FIG. 2 is a plot of device current versus time for the two parallel power devices of FIG. 1 during turn-on and turn-off.

FIG. 2 shows the unbalanced switching transient currents of the two paralleled power devices. For faster switching transient power devices, such as silicon carbide (SiC) metal-oxide-semiconductor field-effect-transistors (MOSFETs), the current unbalance during turn-on/off transients will become worse. Here, we propose techniques to balance the switching transient currents of paralleled power devices.

Figure 3:
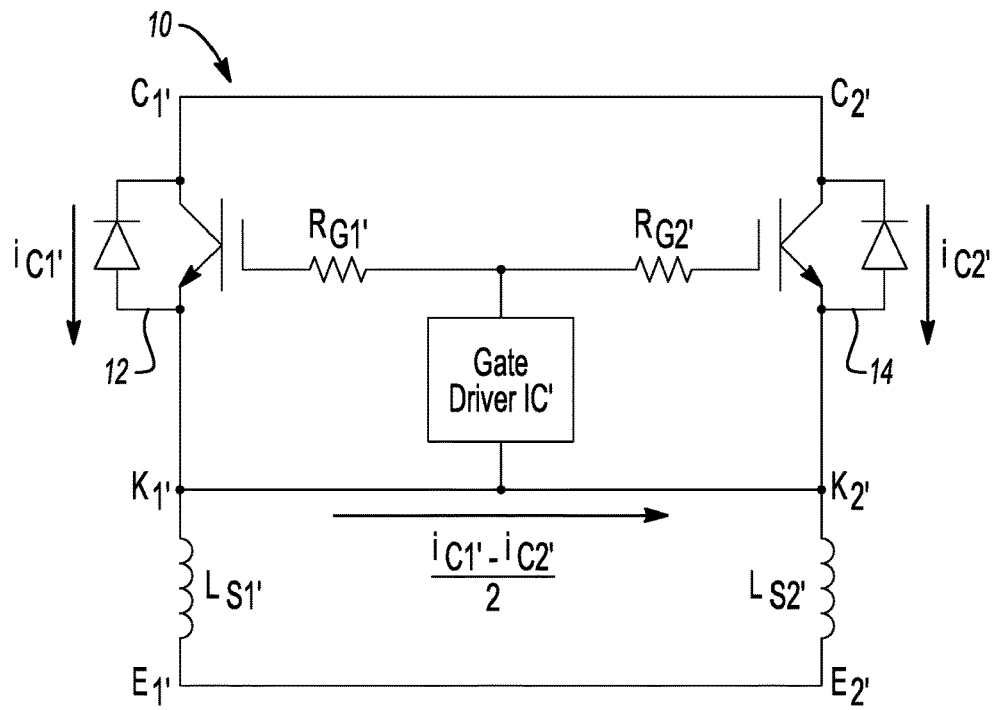
FIG. 3 is a schematic diagram of circuitry including paralleled power devices.

FIG. 3 shows a circuit schematic 10 of paralleled power devices/modules 12, 14. The power devices, 12, 14 (e.g., SiC power MOSFETs, insulated-gate bipolar transistors (IGBTs), etc.) share a single gate driver IC' and are connected at collector terminals $C_{1'}$, $C_{2'}$, power emitter terminals $E_{1'}$, $E_{2'}$, and Kelvin emitter terminals $K_{1'}$, $K_{2'}$. The Kelvin emitters are used for the device gate drive loop (connected to the negative pin of the gate driver IC') to separate the gate drive loop from the power loop. $L_{S1'}$ and $L_{S2'}$ are the power loop parasitic inductances. Gate resistors for the power devices 12, 14 are labelled $R_{G1'}$, $R_{G2'}$ respectively. Assume the power devices 12, 14 have unbalanced currents during switching transients due to different $V_t h$ and/or an unbalanced gate loop design. So, the main currents $i_{C1'}$, $i_{C2'}$, of the power devices 12, 14, are not equal during turn-on/off transients. The circulating current $(i_{C1'}-i_{C2'})/2$ will mainly flow through the Kelvin emitter paths instead of the power emitter paths because Kelvin emitter paths usually have much smaller impedance than power emitter paths.

Figure 4:
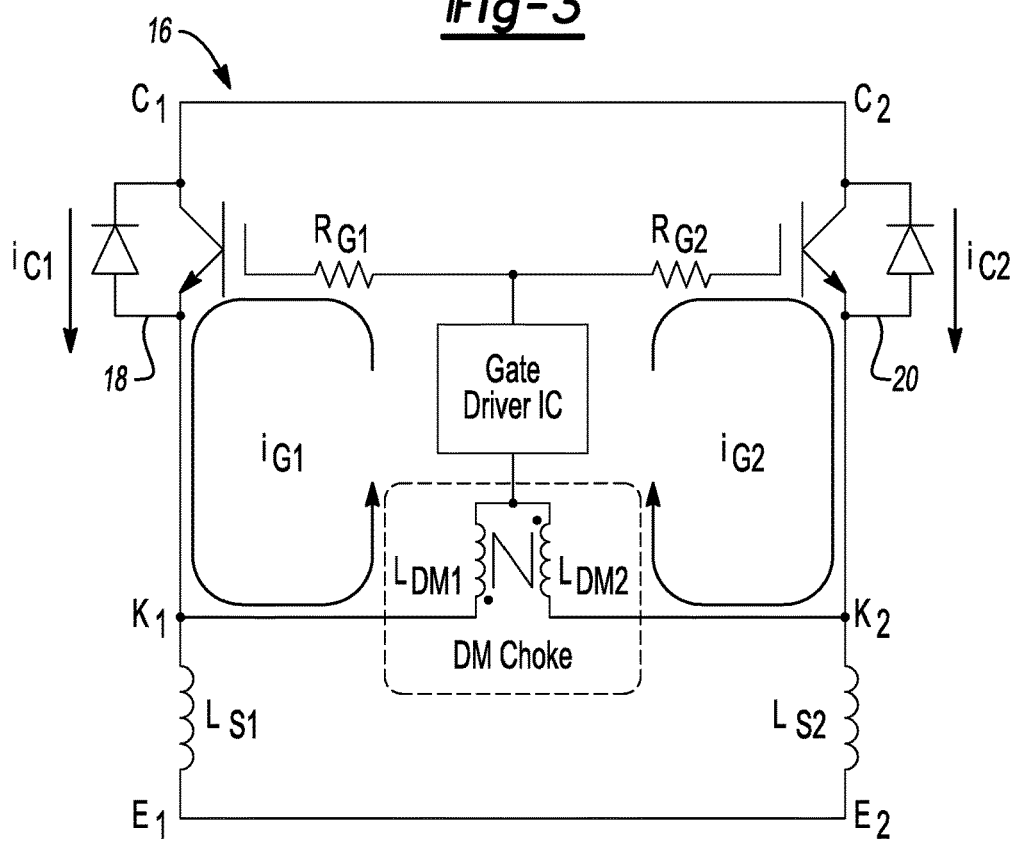
FIG. 4 is a schematic diagram of circuitry including paralleled power devices and a gate loop differential mode choke.

One proposal to balance switching transient currents is shown in FIG. 4. A circuit schematic 16 of paralleled power devices/modules 18, 20 share a single gate driver IC and are connected at collector terminals $C_1$, $C_2$, power emitter terminals $E_1$, $E_2$, and Kelvin emitter terminals $K_1$, $K_2$. The Kelvin emitters are used for the device gate drive loop (connected to the negative pin of the gate driver IC) to separate the gate drive loop from the power loop. $L_{S1}$ and $L_{S2}$ are the power loop parasitic inductances. Gate resistors for the power devices 12, 14 are labelled $R_{G1}$, $R_{G2}$ respectively. The circuit schematic 16 also includes a differential mode (DM) choke in the Kelvin emitter paths of the paralleled power devices 18, 20. One winding $L_{DM1}$ of the DM choke is in series with the Kelvin emitter terminal $K_1$ of the power device 18, and another winding $L_{DM2}$ is in series with the Kelvin emitter terminal $K_2$ of the power device 20. The DM choke can be placed on the gate drive power circuit board easily and does not occupy much extra space.

For balanced currents $i_{C1}$ and $i_{C2}$, there will be no voltage between the two Kelvin emitters $K_1$, $K_2$. The flux in windings $L_{DM1}$, $L_{DM2}$ generated via balanced gate loop currents $i_{G1}$, $i_{G2}$ respectively will cancel each other. So, the DM choke will not impact the gate drive loop of the power devices 18, 20.

Figure 5:
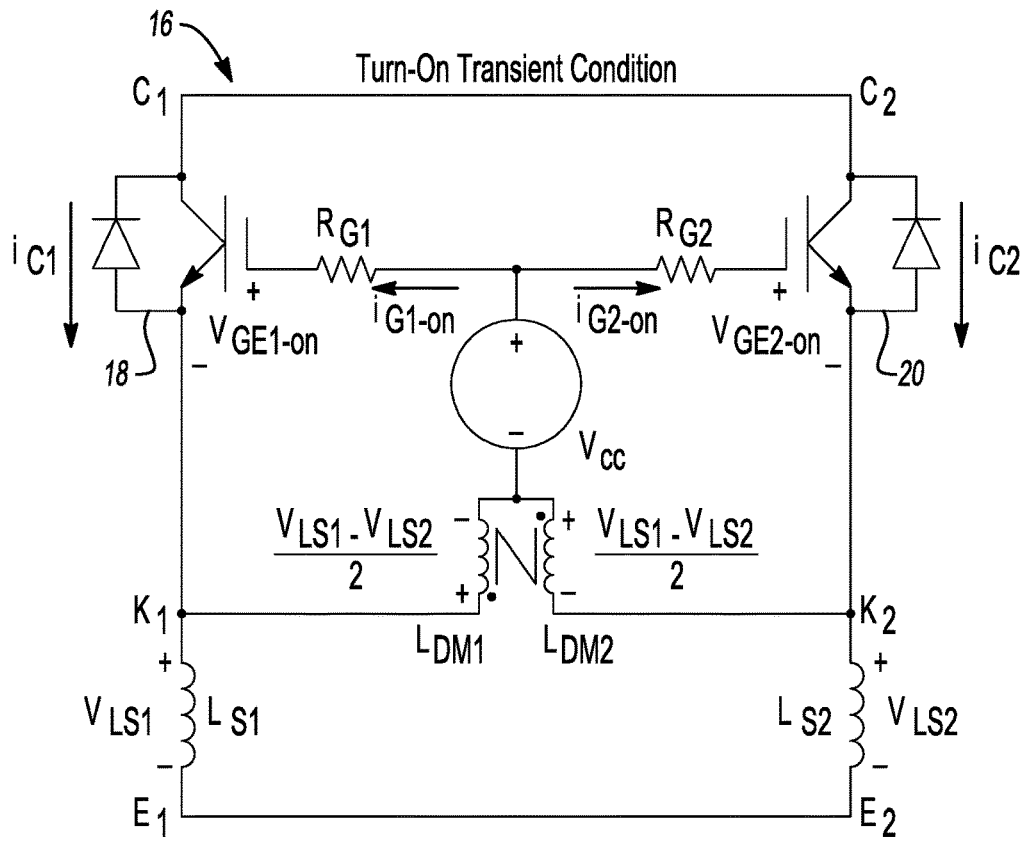

During the turn-on transient condition of FIG. 5, the gate driver provides positive voltage $V_{CC}$ to turn on the power devices 18, 20. For a typical IGBT, $V_{CC}$ is usually 15V. For a typical MOSFET, $V_{CC}$ is usually to 20V. Power device current is increases during the turn-on transient and causes a voltage drop on the power loop parasitic inductance $(V_{LS}=L_S*di_C/dt)$. Assuming current from the power device 18 rises faster than current from the power device 20, the voltage drop on its emitter side parasitic inductance is higher, e.g. $V_{LS1}>V_{LS2}$. The difference in parasitic inductance voltage drop $(V_{LS1}-V_{LS2})$ will be added on to the Kelvin emitter path impedance, e.g., the windings $L_{DM1}$, $L_{DM2}$. Assuming the windings $L_{DM1}$, $L_{DM2}$ are symmetrical, each winding will have a voltage drop of $(V_{LS1}-V_{LS2})/2$ thereacross. As a result, the voltage added to the gates of the power devices 18, 20 will be $V_{GE1-on}=V_{CC}-i_{G1-on}*R_{G1}-(V_{LS1}-V_{LS2})/2$ for the power device 18, and $V_{GE2-on}=V_{CC}-i_{G2-on}*R_{G2}+(V_{LS1}-V_{LS2})/2$ for the power device 20. For paralleled power devices, the same gate resistors are usually used and the gate loop current will also be the same. That is, $R_{G1}=R_{G2}$ and $i_{G1-on}=i_{G2-on}$. Comparing this with the case of not adding the DM choke in which $V_{GE1-on}'=V_{CC}-i_{G1-on}'*R_{G1}'$, $V_{GE2-on}'=V_{CC}-i_{G2-on}*R_{G2}'$, and $V_{GE1-on}'=V_{GE2-on}'$, the gate voltage of the power device 18 is decreased (e.g., $V_{GE1}<V_{GE1}'$) and the gate voltage of the power device 20 is increased (e.g., $V_{GE2-on}>V_{GE2-on}'$). As a result, the current rising speed $di_{C1}/dt$ is slowed due to reduced gate voltage and $di_{C2}/dt$ is sped up due to the increased gate voltage, until $di_{C1}/dt=di_{C2}/dt$.

Figure 6:
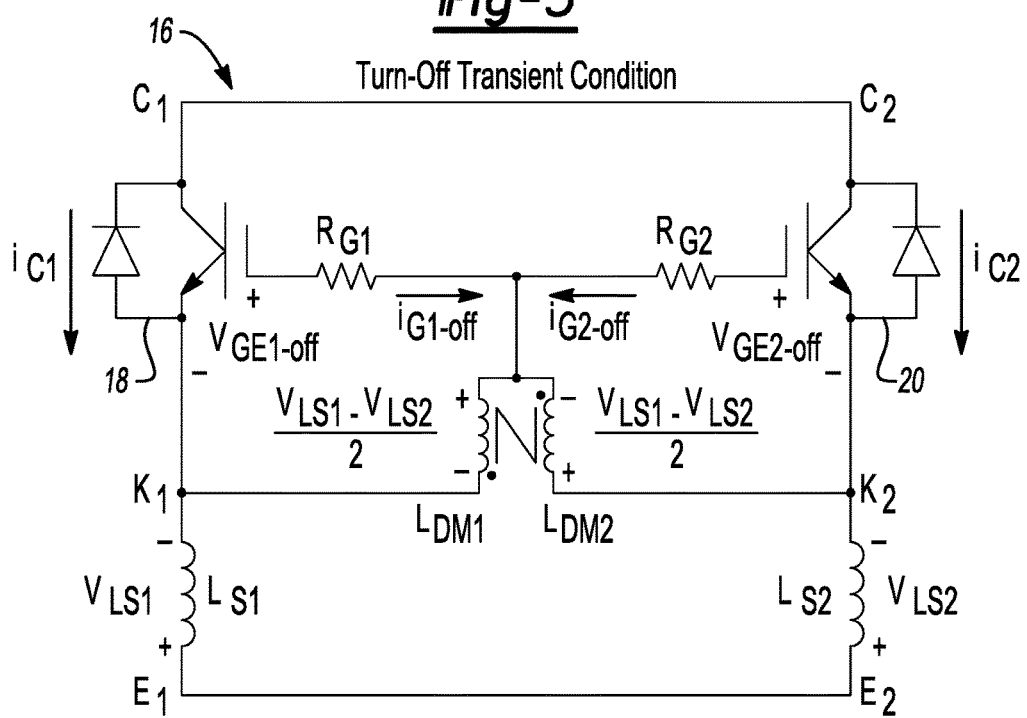
FIG. 6 is a schematic diagram of the circuitry of FIG. 4 during device turn-off.

Similarly with reference to FIG. 6 during the turn-off transient condition $(V_{CC}=0)$, $(V_{LS1}-V_{LS2})$ will also be added to windings $L_{DM1}$, $L_{DM2}$ (assume current from the power device 18 falls faster than current from the power device 20). The direction of $(V_{LS1}-V_{LS2})$ will be reversed as compared with the case of the turn-on transient condition because the falling of $i_{C1}$ and $i_{C2}$ generated $V_{LS1}$ and $V_{LS2}$ will have reverse direction as compared with the case of the turn-on transient condition. Then, the gate voltage of the power device 18 will be increased from the original case (the case without the DM choke) of $V_{GE1-off}'=i_{G1-off}'*R_{G1}'$ to $V_{GE1-off}=i_{G1-off}*R_{G1}+(V_{LS1}-V_{LS2})/2$ to slow down the current falling speed $(di_{C1}/dt)$. For the power device 20, the gate voltage will be reduced from $V_{GE2-off}'=i_{G2-off}'*R_{G2}'$ to $V_{GE2-off}=i_{G2-off}*R_{G1}-(V_{LS1}-V_{LS2})/2$ to speed up the falling speed $(di_{C2}/dt)$.

Figure 7:
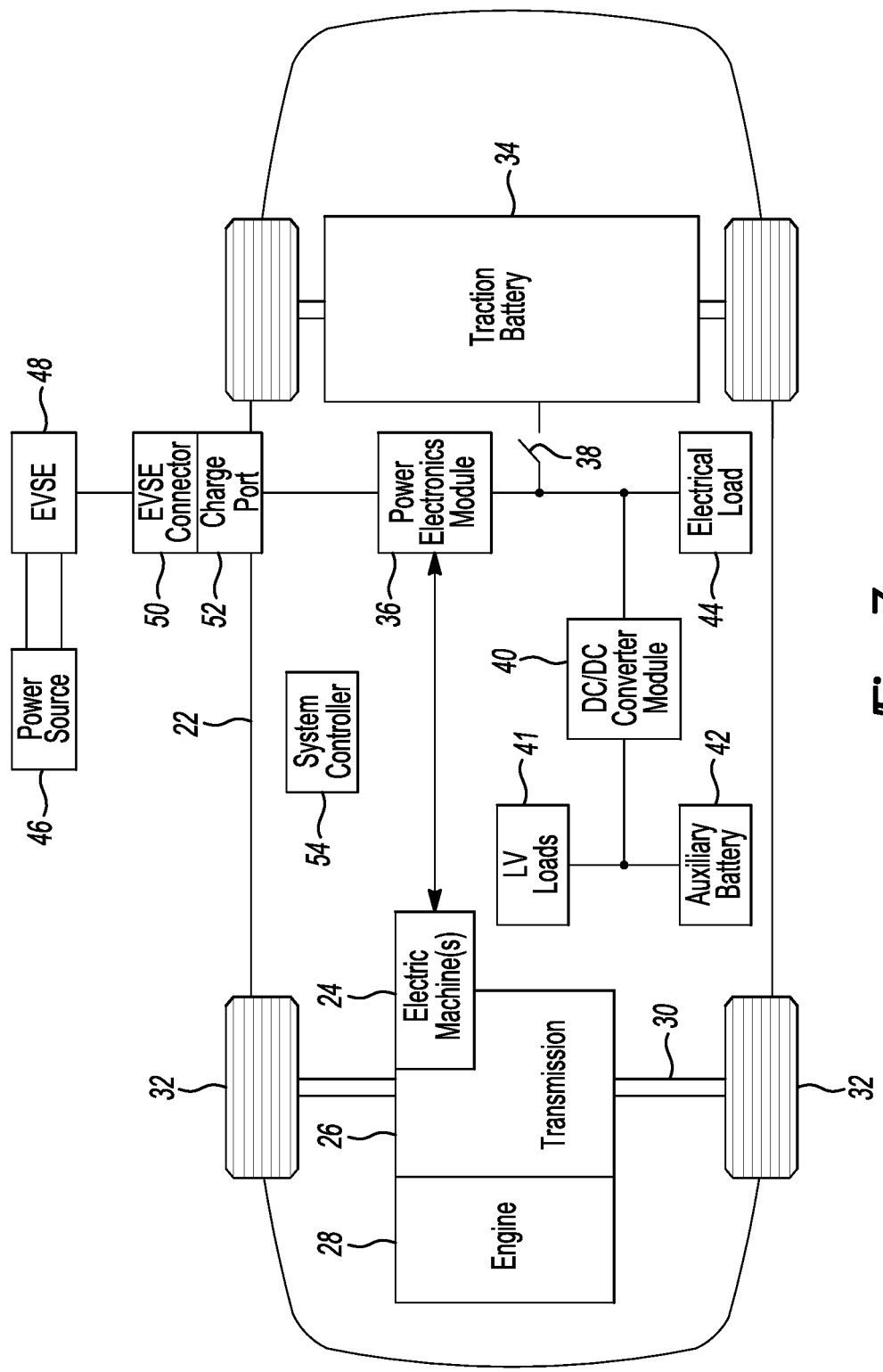
FIG. 7 is a schematic diagram of a vehicle.

The circuitry contemplated herein may be implemented within a variety of vehicle modules. FIG. 7, for example, depicts an electrified vehicle 22 with such modules. The electrified vehicle 22 includes one or more electric machines 24 mechanically coupled to a hybrid transmission 26. The electric machines 24 may operate as a motor or generator. In addition, the hybrid transmission 26 is mechanically coupled to an engine 28 and a drive shaft 30 that is mechanically coupled to the wheels 32.

A traction battery or battery pack 34 stores energy that can be used by the electric machines 24. The vehicle battery pack 34 may provide a high voltage direct current (DC) output. The traction battery 34 may be electrically coupled to one or more power electronics modules 36 that implement the DM choke architectures discussed above. One or more contactors 38 may further isolate the traction battery 34 from other components when opened and connect the traction battery 34 to other components when closed. The power electronics module 36 is also electrically coupled to the electric machines 24 and provides the ability to bi-directionally transfer energy between the traction battery 34 and the electric machines 24. For example, the traction battery 34 may provide a DC voltage while the electric machines 24 may operate with alternating current (AC) to function. The power electronics module 36 may convert the DC voltage to AC current to operate the electric machines 24. In regenerative mode, the power electronics module 36 may convert the AC current from the electric machines 24 acting as generators to DC voltage compatible with the traction battery 34.

The vehicle 22 may include a variable-voltage converter (VVC) (not shown) electrically coupled between the traction battery 34 and power electronics module 36. The VVC may be a DC/DC boost converter configured to increase or boost the voltage provided by the traction battery 34. By increasing the voltage, current requirements may be decreased leading to a reduction in wiring size for the power electronics module 36 and the electric machines 24. Further, the electric machines 24 may be operated with better efficiency and lower losses.

In addition to providing energy for propulsion, the traction battery 34 may provide energy for other vehicle electrical systems. The vehicle 22 may include a DC/DC converter module 40 that converts the high voltage DC output of the traction battery 34 to a low voltage DC supply that is compatible with low-voltage vehicle loads 41. An output of the DC/DC converter module 40 may be electrically coupled to an auxiliary battery 42 (e.g., 12V battery) for charging the auxiliary battery 42. The low-voltage systems may be electrically coupled to the auxiliary battery 42. One or more electrical loads 44 may be coupled to the high-voltage bus. The electrical loads 44 may have an associated controller that operates and controls the electrical loads 44 when appropriate. Examples of electrical loads 44 may include a fan, an electric heating element, and/or an air-conditioning compressor.

The electrified vehicle 22 may be configured to recharge the traction battery 34 from an external power source 46. The external power source 46 may be a connection to an electrical outlet. The external power source 46 may be electrically coupled to a charger or electric vehicle supply equipment (EVSE) 48. The external power source 46 may be an electrical power distribution network or grid as provided by an electric utility company. The EVSE 48 may provide circuitry and controls to regulate and manage the transfer of energy between the power source 46 and the vehicle 22. The external power source 46 may provide DC or AC electric power to the EVSE 48. The EVSE 48 may have a charge connector 50 for plugging into a charge port 52 of the vehicle 22. The charge port 52 may be any type of port configured to transfer power from the EVSE 48 to the vehicle 22. The EVSE connector 50 may have pins that mate with corresponding recesses of the charge port 52. Alternatively, various components described as being electrically coupled or connected may transfer power using a wireless inductive coupling.

In some configurations, the electrified vehicle 22 may be configured to provide power to an external load. For example, the electrified vehicle may be configured to operate as a back-up generator or power outlet. In such applications, a load may be connected to the EVSE connector 50 or other outlet. The electrified vehicle 22 may be configured to return power to the power source 46. For example, the electrified vehicle 22 may be configured to provide alternating current (AC) power to the electrical grid. The voltage supplied by the electrified vehicle may be synchronized to the power line.

Electronic modules in the vehicle 22 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by the Institute of Electrical and Electronics Engineers (IEEE) 802 family of standards. Additional channels of the vehicle network may include discrete connections between modules and may include power signals from the auxiliary battery 42. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown but it may be implied that the vehicle network may connect to any electronic module that is present in the vehicle 22. A vehicle system controller (VSC) 134 may be present to coordinate the operation of the various components.

The vehicle 22 also includes the DC/DC converter module 40 for converting the voltage of the high-voltage bus to a voltage level suitable for the auxiliary battery 42 and low-voltage loads 41 (e.g., around 12 Volts). The vehicle 22 may further include additional switches, contactors, and circuitry to selectively select power flow between the traction battery 34 to the DC/DC converter 40.

The processes, methods, logic, or strategies disclosed may be deliverable to and/or implemented by a processing device, controller, or computer, which may include any existing programmable electronic control unit or dedicated electronic control unit. Similarly, the processes, methods, logic, or strategies may be stored as data and instructions executable by a controller or computer in many forms including, but not limited to, information permanently stored on various types of articles of manufacture that may include persistent non-writable storage media such as ROM devices, as well as information alterably stored on writeable storage media such as floppy disks, magnetic tapes, CDs, RAM devices, and other magnetic and optical media. The processes, methods, logic, or strategies may also be implemented in a software executable object. Alternatively, they may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. Paralleled power semiconductor circuitry comprising:
a pair of power transistors in parallel;
a gate driver configured to power gates of the power transistors; and
a differential mode choke arranged with the pair and gate driver such that a difference in current magnitudes output by the power transistors results in current flow through the choke that (i) lowers a gate voltage of the power transistor with a greater one of the current magnitudes and (ii) raises a gate voltage of the power transistor with a lesser one of the current magnitudes to increase a difference between the gate voltages.

2. The circuitry of claim 1, wherein the differential mode choke includes a pair of magnetically coupled windings having opposite polarity.

3. The circuitry of claim 2, wherein a terminal of the differential mode choke provides output to a negative terminal of the gate driver.

4. The circuitry of claim 3, wherein the windings share the terminal.

5. Power semiconductor circuitry comprising:
a pair of parallel power transistors, a gate driver configured to power gates of the power transistors, and a differential mode choke arranged to, responsive to current flow through the choke, lower a gate voltage of one of the power transistors and raise a gate voltage of the other of the power transistors to increase a difference between the gate voltages and reduce the current flow.

6. The power semiconductor circuitry of claim 5, wherein the current flow results from a difference in current magnitudes output by the power transistors.

7. The power semiconductor circuitry of claim 5, wherein the differential mode choke includes a pair of magnetically coupled windings having opposite polarity.

8. The power semiconductor circuitry of claim 7, wherein a terminal of the differential mode choke provides output to a negative terminal of the gate driver.

9. The power semiconductor circuitry of claim 8, wherein the windings share the terminal.

10. A vehicle comprising:
    a traction battery;
    an electric machine; and
    a power electronics module arranged to pass power between the traction battery and electric machine, and including a pair of parallel power transistors and a differential mode choke arranged to, responsive to current flow through the Choke, drive gate voltages of the power transistors to increase a difference between the gate voltages and reduce a difference in current magnitudes output by the transistors.

11. The vehicle of claim 10, wherein the differential mode choke includes a pair of magnetically coupled windings having opposite polarity.

12. The vehicle of claim 11, wherein the power electronics module further includes a gate driver configured to power gates of the transistors and wherein a terminal of the differential mode choke provides output to a negative terminal of the gate driver.

13. The vehicle of claim 12, wherein the windings share the terminal.

14. The vehicle of claim 10, wherein the current flow results from the difference between the current magnitudes.

* * * * *